United States Patent
Kohama

(10) Patent No.: US 9,824,986 B2
(45) Date of Patent: *Nov. 21, 2017

(54) HIGH-FREQUENCY DEVICE INCLUDING HIGH-FREQUENCY SWITCHING CIRCUIT

(71) Applicant: Sony Corporation, Tokyo (JP)

(72) Inventor: Kazumasa Kohama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 62 days.

This patent is subject to a terminal disclaimer.

(21) Appl. No.: 15/193,893

(22) Filed: Jun. 27, 2016

(65) Prior Publication Data
US 2016/0307857 A1    Oct. 20, 2016

Related U.S. Application Data

(63) Continuation of application No. 14/755,613, filed on Jun. 30, 2015, now Pat. No. 9,406,696, which is a
(Continued)

(30) Foreign Application Priority Data

Jul. 20, 2005  (JP) .................. 2005-210169

(51) Int. Cl.
*H01L 29/66* (2006.01)
*H01L 23/66* (2006.01)
(Continued)

(52) U.S. Cl.
CPC .......... *H01L 23/66* (2013.01); *H01L 23/3114* (2013.01); *H01L 23/4952* (2013.01);
(Continued)

(58) Field of Classification Search
CPC ........................................... H01L 23/66
(Continued)

(56) References Cited

U.S. PATENT DOCUMENTS 3,802,967 A    4/1974   Ladany et al.
5,015,873 A    5/1991   Hirayama
(Continued)

FOREIGN PATENT DOCUMENTS

JP    1976-039827    10/1976
JP    1988-086555    4/1988
(Continued)

OTHER PUBLICATIONS

Japanese Office Examination Report issued in connection with related Japanese Patent Application No. 2005-210189 dated Apr. 13, 2011.
(Continued)

*Primary Examiner* — Ajay K Arora
(74) *Attorney, Agent, or Firm* — Dentons US LLP

(57) ABSTRACT

A high-frequency device having a switching circuit including a semiconductor substrate; a first high-frequency input/output terminal; a second high-frequency input/output terminal; a control signal input terminal; a power terminal; a ground terminal; an insulating portion disposed on a main surface of the semiconductor substrate; and a voltage-applying electrode for applying a predetermined positive voltage from the power electrode to the semiconductor substrate, wherein the switching circuit includes a field-effect transistor disposed in an active region of the semiconductor substrate.

8 Claims, 9 Drawing Sheets

Related U.S. Application Data continuation of application No. 14/029,996, filed on Sep. 18, 2013, now Pat. No. 9,105,564, which is a continuation of application No. 11/458,521, filed on Jul. 19, 2006, now Pat. No. 8,598,629.

(51) Int. Cl.

| | | |
|---|---|---|
| *H01L 27/12* | (2006.01) | |
| *H01L 27/06* | (2006.01) | |
| *H01L 49/02* | (2006.01) | |
| *H01L 29/20* | (2006.01) | |
| *H01L 23/31* | (2006.01) | |
| *H01L 23/495* | (2006.01) | |
| *H01L 29/201* | (2006.01) | |
| *H01L 29/205* | (2006.01) | |
| *H01L 29/778* | (2006.01) | |
| *H01L 23/00* | (2006.01) | |

(52) U.S. Cl.
CPC .. *H01L 23/49513* (2013.01); *H01L 23/49541* (2013.01); *H01L 27/0605* (2013.01); *H01L 27/0629* (2013.01); *H01L 27/1203* (2013.01); *H01L 28/20* (2013.01); *H01L 29/20* (2013.01); *H01L 29/201* (2013.01); *H01L 29/205* (2013.01); *H01L 29/7786* (2013.01); *H01L 24/48* (2013.01); *H01L 24/49* (2013.01); *H01L 2223/6683* (2013.01); *H01L 2224/05554* (2013.01); *H01L 2224/48137* (2013.01); *H01L 2224/49175* (2013.01); *H01L 2924/00014* (2013.01); *H01L 2924/13062* (2013.01); *H01L 2924/14* (2013.01); *H01L 2924/1423* (2013.01); *H01L 2924/19041* (2013.01)

(58) Field of Classification Search
USPC .................................................. 257/197
See application file for complete search history.

(56) References Cited

U.S. PATENT DOCUMENTS

| | | |
|---|---|---|
| 5,163,169 A | 11/1992 | Maemura et al. |
| 5,194,395 A | 3/1993 | Wada |
| 6,096,587 A | 8/2000 | Imoto et al. |
| 6,121,841 A | 9/2000 | Sakuno |
| 6,169,461 B1 | 1/2001 | Andoh et al. |
| 6,208,023 B1 | 3/2001 | Nakayama et al. |
| 6,492,195 B2 | 12/2002 | Nakanishi et al. |
| 6,775,525 B1 | 8/2004 | Tanoue et al. |
| 6,891,267 B2 | 5/2005 | Asano et al. |
| 6,903,596 B2 | 6/2005 | Geller et al. |
| 7,076,216 B2 | 7/2006 | Hayashi |
| 7,132,892 B2 | 11/2006 | Kuriyama et al. |
| 2002/0024392 A1 | 2/2002 | Maruyama et al. |
| 2002/0033510 A1 | 3/2002 | Tomita |
| 2002/0117696 A1 | 8/2002 | Hirai et al. |
| 2002/0153582 A1 | 10/2002 | Takehara et al. |
| 2003/0189246 A1 | 10/2003 | Iwaki et al. |
| 2004/0077150 A1 | 4/2004 | Tosaka |
| 2004/0245527 A1 | 12/2004 | Tsukagoshi et al. |
| 2005/0030231 A1 | 2/2005 | Nagaishi et al. |
| 2006/0102960 A1 | 5/2006 | Masieid |
| 2006/0151816 A1 | 7/2006 | Asano et al. |
| 2006/0249752 A1 | 11/2006 | Asano |

FOREIGN PATENT DOCUMENTS

| | | |
|---|---|---|
| JP | 1991-011095 | 1/1991 |
| JP | 1991-068165 | 3/1991 |
| JP | 1992-097561 | 3/1992 |
| JP | 1993-013561 | 1/1993 |
| JP | 1996-031791 | 2/1996 |
| JP | 1997-102585 | 4/1997 |
| JP | 11274867 | 10/1999 |
| JP | 2000-295001 | 10/2000 |
| JP | 2005-101097 | 4/2005 |

OTHER PUBLICATIONS

Hisanori, Uda et al., "A Very High Isolation GaAs SPDT Switch IC Sealed in an Ultra-Compact Plastic Package", GaAs IC Symposium, 1995, IEEE, pp. 132-135H.

FIG. 11

MEASUREMENT CONDITION
Vdd=2.85V,
INPUT SIGNAL1 (RF1) : INPUT POWER=21.5dBm, FREQUENCY=f1=1,950MHz
INPUT SIGNAL2 (RF1) : INPUT POWER=−15dBm, FREQUENCY=f2

|  | IMD2 (*1) | | IMD3 (*2) | |
|---|---|---|---|---|
| f2 | 190MHz | 4,090MHz | 1,760MHz | 6,040MHz |
| RELATED EXAMPLE | −99.3dBm | −97.6dBm | −95.2dBm | −96.1dBm |
| INVENTIVE EXAMPLE | −103.5dBm | −103.5dBm | −101.3dBm | −102.5dBm |

*1: SECOND-ORDER INTERMODULATION DISTORTION GENERATED AT 2,140 MHz WHEN FEEDING RF1 AND RF2 SIGNALS
*2: THIRD-ORDER INTERMODULATION DISTORTION GENERATED AT 2,140 MHz WHEN FEEDING RF1 AND RF2 SIGNALS

FIG. 12

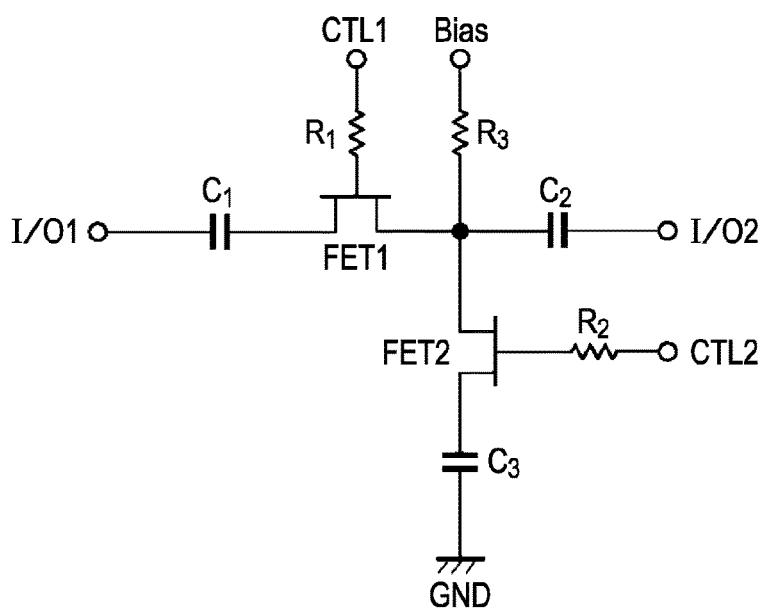

HIGH-FREQUENCY DEVICE INCLUDING HIGH-FREQUENCY SWITCHING CIRCUIT

CROSS REFERENCES TO RELATED APPLICATIONS

This application is a continuation of U.S. patent application Ser. No. 14/755,613 filed Jun. 30, 2015, which is a continuation of U.S. patent application Ser. No. 14/029,996 filed Sep. 18, 2013, now U.S. Pat. No. 9,105,564 issued Aug. 11, 2015, which is a continuation of U.S. patent application Ser. No. 11/458,521 filed Jul. 19, 2006, now U.S. Pat. No. 8,598,629 issued on Dec. 3, 2013, the entireties of which are incorporated herein by reference to the extent permitted by law. The present invention contains subject matter related to Japanese Patent Application JP 2005-210169 filed in the Japanese Patent Office on Jul. 20, 2005, the entire contents of which are incorporated herein by reference.

BACKGROUND OF THE INVENTION

1. Field of the Invention

The present invention relates to high-frequency devices including high-frequency switching circuits and being applicable to, for example, cellular phones.

2. Description of the Related Art

For example, cellular phones have communicated with each other using high-frequency signals having frequencies in the range of 800 MHz to 2.3 GHz. In such relatively high frequencies, compound semiconductors such as GaAs, which has high electron mobility, in place of known Group IV semiconductors, such as a Si semiconductor, have often been used for power amplifiers (PAs) for amplifying transmission powers, low-noise amplifiers (LNA) for amplifying received signals, and switching circuits for switching signals, in view of high-frequency characteristics.

Devices including high-frequency integrated circuits containing the compound semiconductors such as GaAs have satisfactory high-frequency characteristics when the devices are driven at low voltages. However, as trends toward lower voltage and higher performance grow, there have been further stringent demands for the improvement of frequency characteristics, in particular, a reduction in distortion of switching circuits that correspond to third-generation (3G) cellular phones and that enable simultaneous transmission and reception.

For example, as switching circuits for switching antennae in cellular phones, from the above-described reasons, switch monolithic microwave integrated circuits (switch MMICs) including field-effect transistors (FETs) each containing a GaAs compound semiconductor have often been used. Such antenna-switching circuits are required to meet stringent requirements: low loss, low distortion, and the like at a low operating voltage, e.g., at an operating voltage of 2.6 V.

Various switch ICs have been proposed (for example, see Uda. A Very High Isolation GaAs SPDT Switch IC Seald in an Ultra-compact Plastic Package. IEEE GaAs IC Symposium 1995, pp. 132-135H).

FIG. 12 is a circuit diagram showing the most basic switching circuit including junction gate field-effect transistors (J-FETs) each containing, for example, a GaAs compound semiconductor. In this case, a first FET1 and a second FET2 are disposed on a common GaAs substrate, the first FET1 and the second FET2 each being a J-FET. The source of the first FET1 is connected to the drain of the second FET2. One end of the current channel of the first FET1 is connected to a first input/output terminal I/O1 with a capacitor C1, the other end is connected to a second input/output terminal I/O2 via a capacitor C2. One end of the current channel of the second FET2 is connected to a ground terminal GND via a capacitor C3. Thereby, the circuit is DC-decoupled from the exterior.

The gate of the first FET1 is connected to a control signal input terminal CTL1 via a resistor R1. The gate of the second FET2 is connected to a control signal input terminal CTL2 via a resistor R2. The midpoint of the current channel between the source of the first FET1 and the drain of the second FET2 is connected to a DC bias terminal via a resistor R3.

In this switching circuit 11, for example, a logic circuit applies a bias voltage of 2 V to the switching circuit via the resistor R3. For example, when a high voltage, e.g., 3 V, is applied to the terminal CTL1, the gate bias (with respect to the drain and source) of the first FET1 is 1 V. As a result, the FET1 is ON. On the other hand, for example, when a low voltage, e.g., 0 V, is applied to the terminal CTL2, the gate bias (with respect to the drain and source) of the second FET2 is −2 V. As a result, the FET2 is OFF. Therefore, the channel between the terminals I/O1 and I/O2 is ON, that is, the switching circuit is ON.

In contrast, for example, when a low voltage, e.g., 0 V, is applied to the terminal CTL1, the gate bias (with respect to the drain and source) of the first FET1 is −2 V. As a result, the FET1 is OFF. On the other hand, for example, when a high voltage, e.g., 3 V, is applied to the terminal CTL2, the gate bias (with respect to the drain and source) of the second FET2 is 1 V. As a result, the FET2 is ON. Therefore, the channel between the terminals I/O1 and I/O2 is OPEN. That is, the signal channel is high-frequency-short-circuited, thus ensuring further isolation.

FIG. 13 is a schematic cross-sectional view of a mounted high-frequency device including a known switch MMIC having the above-described switching circuit.

In this case, a switch MMIC 102 is mounted on a conductive die pad 101. Electrodes of the MMIC 102 are connected to first and second high-frequency input/output terminals I/O1 and I/O2, at which a high frequency is inputted or outputted, with lead wires 104 or the like. The switch MMIC 102, the conductive die pad 101, and the first and second high-frequency input/output terminals I/O1 and I/O2 are covered with a resin mold 105 to form a packaged integrated circuit (IC). The packaged IC is disposed on a circuit board 100. The conductive die pad 101 and the first and second high-frequency input/output terminals I/O1 and I/O2 are electrically connected to the circuit board 100.

The die pad 101 is formed of a conductive metal layer and is grounded.

FIG. 14 is a schematic fragmentary cross-sectional view of a junction gate field-effect transistor (J-FET) containing, for example, GaAs. In this case, a lightly doped semiconductor layer constituting a channel-forming region 107 is disposed on a GaAs substrate 106 composed of bulk GaAs and is disposed between, for example, two heavily doped N regions, i.e., a source region 108S and a drain region 108D. A drain electrode D, a source electrode S, and a gate electrode G are in ohmic contact with the drain region, the source region, and the gate region, respectively.

The presence of the semiinsulating GaAs substrate 106 disposed directly below the channel-forming region 107, i.e., remote from a gate region 109, minimizes leakage of a signal.

SUMMARY OF THE INVENTION

As described above, in consumer applications typified by cellular phones, high-frequency MMICs each containing a GaAs compound semiconductor have often been used. Achievement of high-frequency GaAs ICs having satisfactory high-frequency performance and productivity is required.

However, in the high-frequency switching circuits each containing the compound semiconductor, it is difficult to sufficiently achieve lower distortion, which is a stringent requirement, with high reliability.

According to an embodiment of the present invention, there is provided a high-frequency device including a high-frequency switching circuit that overcomes such disadvantages.

According to an embodiment of the present invention, there is provided a high-frequency device including a switching circuit that overcomes such disadvantages.

A high-frequency device having a switching circuit according to an embodiment of the present invention includes a compound semiconductor substrate; a first high-frequency input/output terminal; a second high-frequency input/output terminal; a control signal input terminal; a power terminal; a ground terminal; an insulating portion disposed on one main surface of the compound semiconductor substrate; and a voltage-applying electrode for applying a predetermined positive voltage from the power electrode to the compound semiconductor substrate, wherein the switching circuit having a field-effect transistor disposed on the other main surface of the active region of the compound semiconductor substrate.

In the above-described high-frequency device having the switching circuit according to an embodiment of the present invention, the positive voltage applied to the compound semiconductor substrate is a fixed positive voltage.

In the above-described device according to an embodiment of the present invention, the insulating portion is disposed on the back surface of the compound semiconductor substrate constituting the switching circuit. Thus, the positive voltage is applied to the compound semiconductor substrate while the substrate is electrically isolated from other components. Therefore, it is possible to stably suppress and control a depletion region under the field-effect transistor.

The above-described high-frequency device having the switching circuit according to an embodiment of the present invention further includes a resistor for applying the predetermined positive voltage to the compound semiconductor substrate, the resistor being disposed between the power terminal and the voltage-applying terminal.

The above-described high-frequency device having the switching circuit according to an embodiment of the present invention further includes a metal plate disposed between the compound semiconductor substrate and the insulating portion, the metal plate being attached to the compound semiconductor substrate, wherein the metal plate serves as the voltage-applying electrode.

The high-frequency device having the switching circuit according to an embodiment of the present invention further includes a silicon semiconductor substrate having a complementary metal-oxide semiconductor logic circuit; a control signal input terminal for feeding a control signal to the logic circuit; and a control signal output terminal for receiving a control signal from the logic circuit.

In the high-frequency device having the switching circuit according to an embodiment of the present invention, the compound semiconductor substrate is a GaAs substrate.

In the above-described structure according to an embodiment of the present invention, the insulating portion is disposed on the back surface of the compound semiconductor substrate, and a positive voltage is applied to the substrate. Thus, it is possible to compensate the nonuniformity of control in a production process and to significantly reduce distortion, as compared with a known unstable switching circuit to which a positive voltage is not applied.

This is believed to be due to the following.

With respect to a reduction in the distortion of a switching circuit composed of a compound semiconductor, in a current technique of producing a compound semiconductor, for example, a low-level impurity concentration and a material composition profile are not sufficiently controlled. Thus, the production of the field-effect transistor results in a minute lot-to-lot variation. In an unstable state in which a voltage is not applied to the compound semiconductor substrate, in fact, in the unstable state in which a bias voltage such as a ground voltage is not applied to the compound semiconductor substrate, an undesired trap is left directly below a channel, and a depletion region is difficult to be controlled. This is believed to be the cause for the generation of the distortion.

Furthermore, a large time constant of the capture or release of an electric charge by the trap impairs the high-speed control of a high-frequency circuit.

Moreover, the depletion region is an undesired capacitance component to degrade high-frequency characteristics.

According to an embodiment of the present invention, the substrate is electrically isolated by the insulating portion, and a voltage is applied to the substrate. As a result, the influence of the trap and the depletion region are suppressed, thus reducing the distortion and improving the high-frequency characteristics.

BRIEF DESCRIPTION OF THE DRAWINGS

FIG. 11 is a table showing distortion measurement results of the known device and the device according to the embodiment of the present invention;

FIG. 12 is a circuit diagram of a high-frequency switching circuit;

DESCRIPTION OF THE PREFERRED EMBODIMENTS

A high-frequency device including a switching circuit according to an embodiment of the present invention will be exemplified. It is understood that the present invention is not limited to the embodiment.

Figure 1:
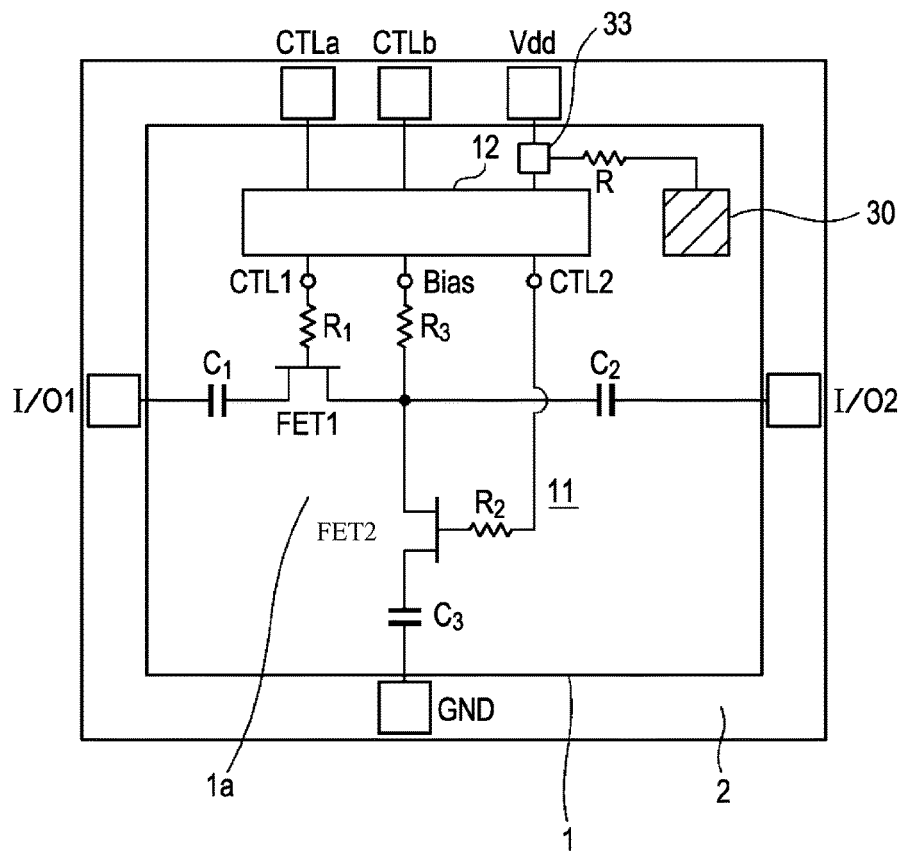
FIG. 1 is a block diagram of a device according to an embodiment of the present invention.
Figure 2:
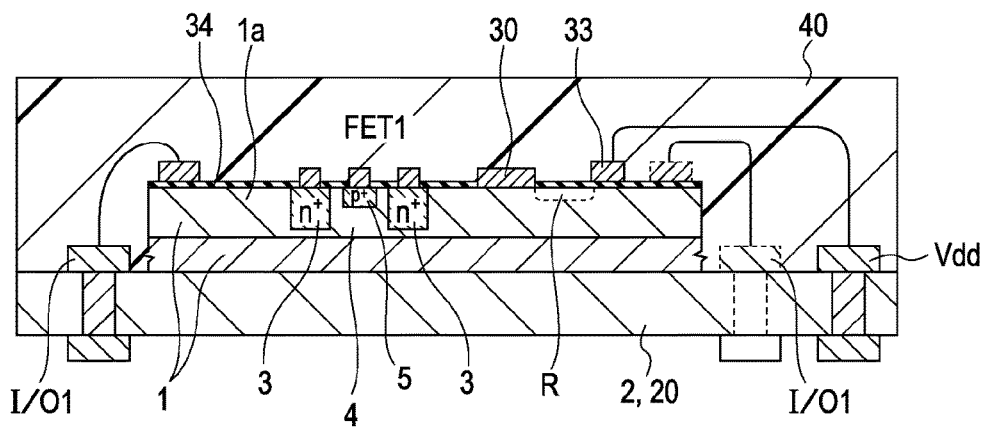
FIG. 2 is a schematic fragmentary cross-sectional view of a device according to an embodiment of the present invention.

FIG. 1 is a block diagram of a device according to the embodiment of the present invention. FIG. 2 is a schematic fragmentary cross-sectional view of the device.

In the present invention, a switching circuit 11 including a FET1 that is a high-electron-mobility transistor (HEMT), a junction field-effect transistor, or the like is disposed on a compound semiconductor substrate 1 composed of GaAs or the like. In this embodiment, the switching circuit 11 and a logic circuit 12 for controlling the switching circuit 11.

An insulating portion 2 is disposed on the back surface of the GaAs compound semiconductor substrate 1, i.e., the insulating portion 2 is disposed on a main surface opposite a main surface at which the field-effect transistor is disposed. In this embodiment, the insulating portion 2 is an insulating package substrate 20 composed of, for example, a glass epoxy resin of flame retardant type 4 (FRT4).

The package substrate 20 includes, for example, first and second input/output terminals I/O1 and I/O2 and a ground terminal GND, which are used for the switching circuit 11; and control signal input terminals CTL1 and CTL2 and a power terminal Vdd, which are used for the logic circuit 12.

The compound semiconductor substrate 1 includes, for example, a high-frequency device containing the switching circuit 11 having the same circuit structure as that shown in FIG. 12 and the logic circuit 12 for driving the switching circuit 11.

In the present invention, the compound semiconductor substrate 1 includes a voltage-applying electrode 30 for applying a predetermined positive voltage to the compound semiconductor substrate 1. A predetermined positive voltage from the power terminal Vdd is applied to the voltage-applying electrode 30. In this case, preferably, a resistor R is disposed between the power terminal Vdd and the voltage-applying electrode 30 to intercept an alternating current component when the voltage is applied to the voltage-applying electrode 30.

For example, a power supply connection terminal 33 is disposed on an insulating surface layer 34 on the compound semiconductor substrate 1. The power supply connection terminal 33 is connected to the power terminal Vdd with a lead wire or the like. The resistor R is formed as a circuit element in the compound semiconductor substrate 1 and is disposed between the power supply connection terminal 33 and the voltage-applying electrode 30.

As described above, the switching circuit 11 includes first and second FET1 and FET2 on the common compound semiconductor substrate 1, for example, a GaAs substrate, the FET1 and FET2 each being a HEMT or a J-FET. The source of the first FET1 is connected to the drain of the second FET2. One end of the current channel of the first FET1 is connected to a first input/output terminal I/O1 with a capacitor C1, the other end is connected to a second input/output terminal I/O2 via a capacitor C2. One end of the current channel of the second FET2 is connected to a ground terminal GND via a capacitor C3. Thereby, the circuit is DC-decoupled from the exterior.

Gates of the first and second FET1 and FET2 are connected to control signal input terminals CTL1 and CTL2 via resistor R1 and R2, respectively, the signal input terminals CTL1 and CTL2 receiving control signals from the logic circuit 12. The midpoint of the current channel between the source of the first FET1 and the drain of the second FET2 is connected to a DC bias terminal via a resistor R3.

The logic circuit 12 is supplied with a voltage from the power terminal Vdd to which a power supply voltage is applied. Control signals from control signal terminals CTLa and CTLb are fed to the logic circuit 12. The logic circuit 12 feeds predetermined control signals to the control signal input terminals CTL1 and CTL2. The logic circuit 12 feeds a predetermined bias voltage to a bias terminal Bias.

The above-described circuit elements, i.e., the switching circuit 11 and the logic circuit 12, are disposed on a main surface of the active region 1a of the compound semiconductor substrate 1. The active region 1a can be formed by ion implantation.

The first field-effect transistor FET1 is exemplified in FIG. 2. The field-effect transistor is formed by the following procedure: for example, a p-type gate region 5 or the like is formed on a channel-forming region 4 having low impurity concentration by ion implantation or the like. An n-type source or drain 3 is similarly formed by ion implantation or the like so as to be disposed at each side of the channel-forming region 4.

A resin mold package 40 covers the compound semiconductor substrate 1 and the like disposed on the package substrate 20.

The switching circuit 11 having the structure is controlled by a signal from the logic circuit 12 and operates in the same way as described in FIG. 12.

That is, for example, a bias voltage of 2 V from the logic circuit 12 is applied to the switching circuit 11 via the resistor R3. For example, when a high voltage, e.g., 3 V, is applied to the terminal CTL1, the gate bias (with respect to the drain and source) of the first FET1 is 1 V. As a result, the FET1 is ON. On the other hand, for example, when a low voltage, e.g., 0 V, is applied to the terminal CTL2, the gate bias (with respect to the drain and source) of the second FET2 is −2 V. As a result, the FET2 is OFF. Therefore, the channel between the terminals I/O1 and I/O2 is ON, that is, the switching circuit 11 is ON.

In contrast, for example, when a low voltage, e.g., 0 V, is applied to the terminal CTL1, the gate bias (with respect to the drain and source) of the first FET1 is −2 V. As a result, the FET1 is OFF. On the other hand, for example, when a high voltage, e.g., 3 V, is applied to the terminal CTL2, the gate bias (with respect to the drain and source) of the second FET2 is 1 V. As a result, the FET2 is ON. Therefore, the channel between the terminals I/O1 and I/O2 is OPEN. That is, the signal channel is high-frequency-short-circuited, thus ensuring further isolation.

In the present invention, as described above, the voltage-applying electrode 30 is disposed on the compound semiconductor substrate 1 in order to apply, for example, a predetermined positive bias voltage to the compound semiconductor substrate 1. This results in a high-frequency device including a switching circuit having improved distortion.

This is believed to result from a decrease in capacitance due to the reduction of the depletion region of the field-effect transistor. For example, this is believed to result from the prevention of the capture and release of an unstable electric charge by a trap or the like.

In the embodiment shown in FIG. 2, the voltage-applying electrode 30 is disposed on a main surface having the circuit elements, such as a FET, of the compound semiconductor substrate 1. Alternatively, as shown in FIG. 3 that is a schematic fragmentary cross-sectional view of a high-frequency device including a switching circuit according to an embodiment of the present invention, the voltage-applying electrode 30 may be constituted of first and second electrodes 31 and 32 that are electrically connected to each other.

In this case, a resistor R may be disposed between the first and second electrodes 31 and 32. Alternatively, the above-described resistor R may be disposed between the first electrode 31 and the power supply connection terminal 33.

Figure 3:
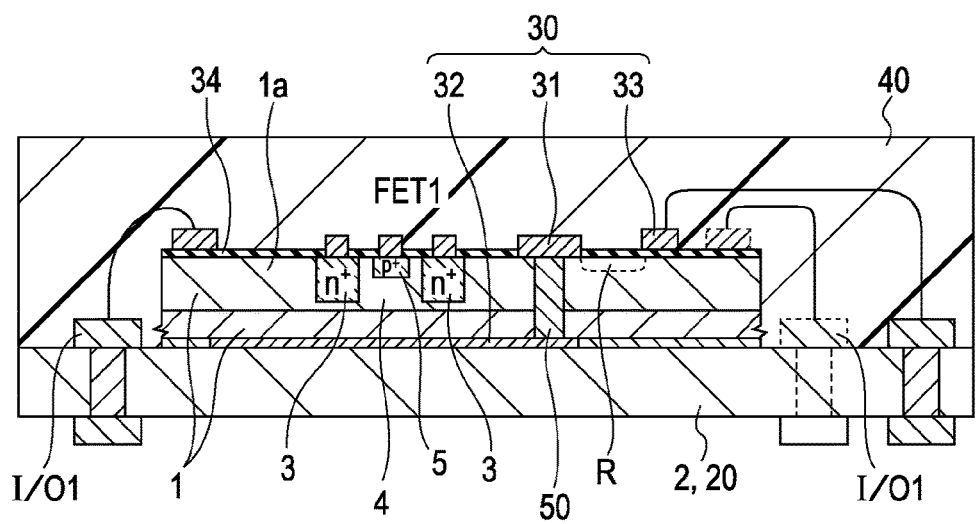
FIG. 3 is a schematic fragmentary cross-sectional view of a device according to another embodiment of the present invention.

As shown in FIG. 3, the first electrode 31 is disposed on one main surface having circuit elements, such as a FET, of the compound semiconductor substrate 1. The second electrode 32 is disposed on the other main surface. A positive voltage can be applied to the compound semiconductor substrate 1 using the second electrode 32.

As shown in FIG. 3, the first electrode 31 may be electrically connected to the second electrodes 32 through a via hole 50 passing through the compound semiconductor substrate 1.

Alternatively, the first electrode 31 may be electrically connected to the second electrodes 32 with lead wires.

In the structure shown in FIG. 3, the second electrode 32 is disposed under at least a region at which field-effect transistors, such as FET1 and FET2, are disposed. However, a larger area of the second electrode 32 results in larger parasitic capacitance, thereby possibly affecting high-frequency characteristics. Thus, the area of the second electrode 32 is preferably 50% or less of that of the compound semiconductor substrate 1.

Figure 4:
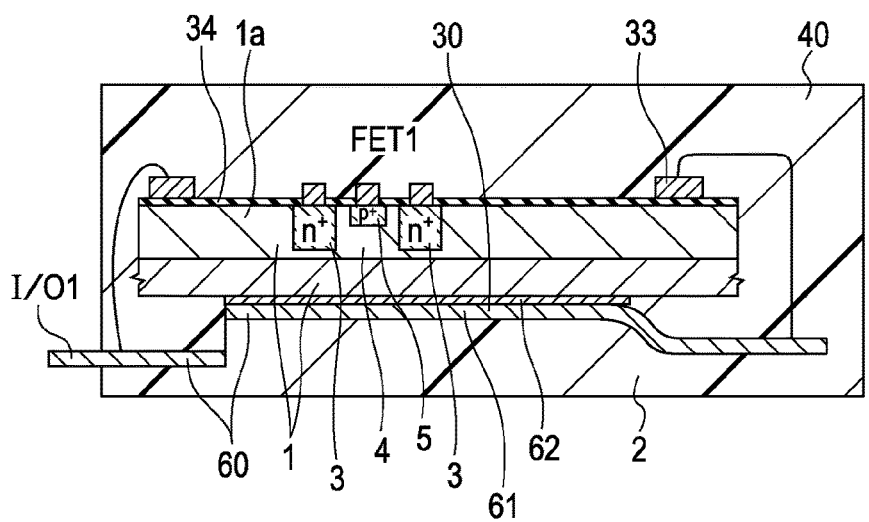
FIG. 4 is a schematic fragmentary cross-sectional view of a device according to another embodiment of the present invention.

FIG. 4 is a schematic cross-sectional view of a device according to another embodiment of the present invention. In this embodiment, a metal plate is disposed between the compound semiconductor substrate and the insulating portion 2.

In this embodiment, a metal plate 60, which is a lead frame, is disposed. A die pad 61 of the lead frame is electrically connected to the back surface of the compound semiconductor substrate 1 shown in FIG. 2 with a conductive material 62, such as a silver paste. The resin mold package 40 functions as the insulating portion 2. In this case, the voltage-applying electrode 30 may be connected to the power terminal Vdd via the die pad 61 and the above-described resistor R.

In FIGS. 3 and 4, the same or equivalent elements corresponding to FIGS. 1 and 2 are designated using the same reference numerals, and redundant description is not repeated.

Figure 5:
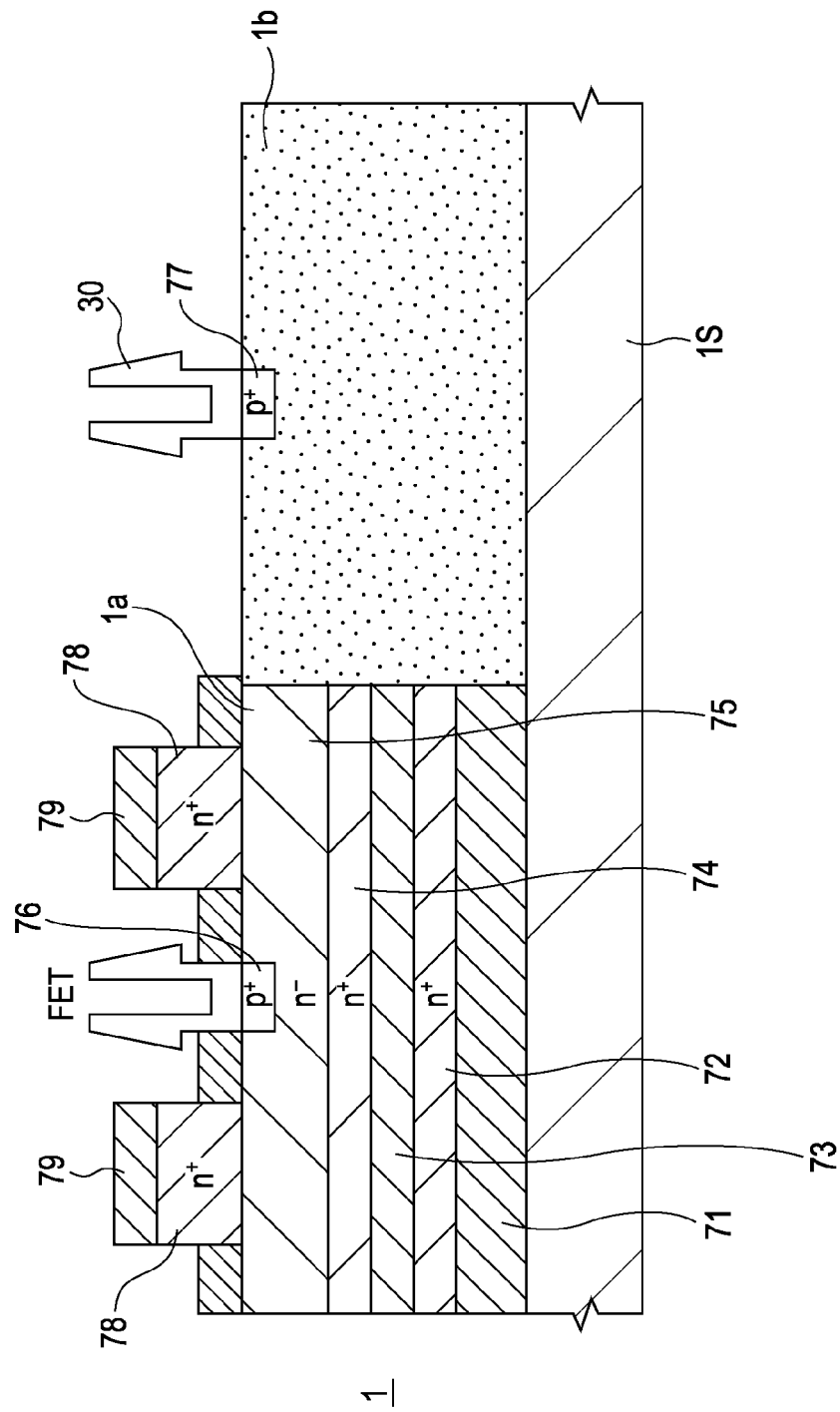
FIG. 5 is a schematic fragmentary cross-sectional view of a device according to another embodiment of the present invention.
Figure 6:
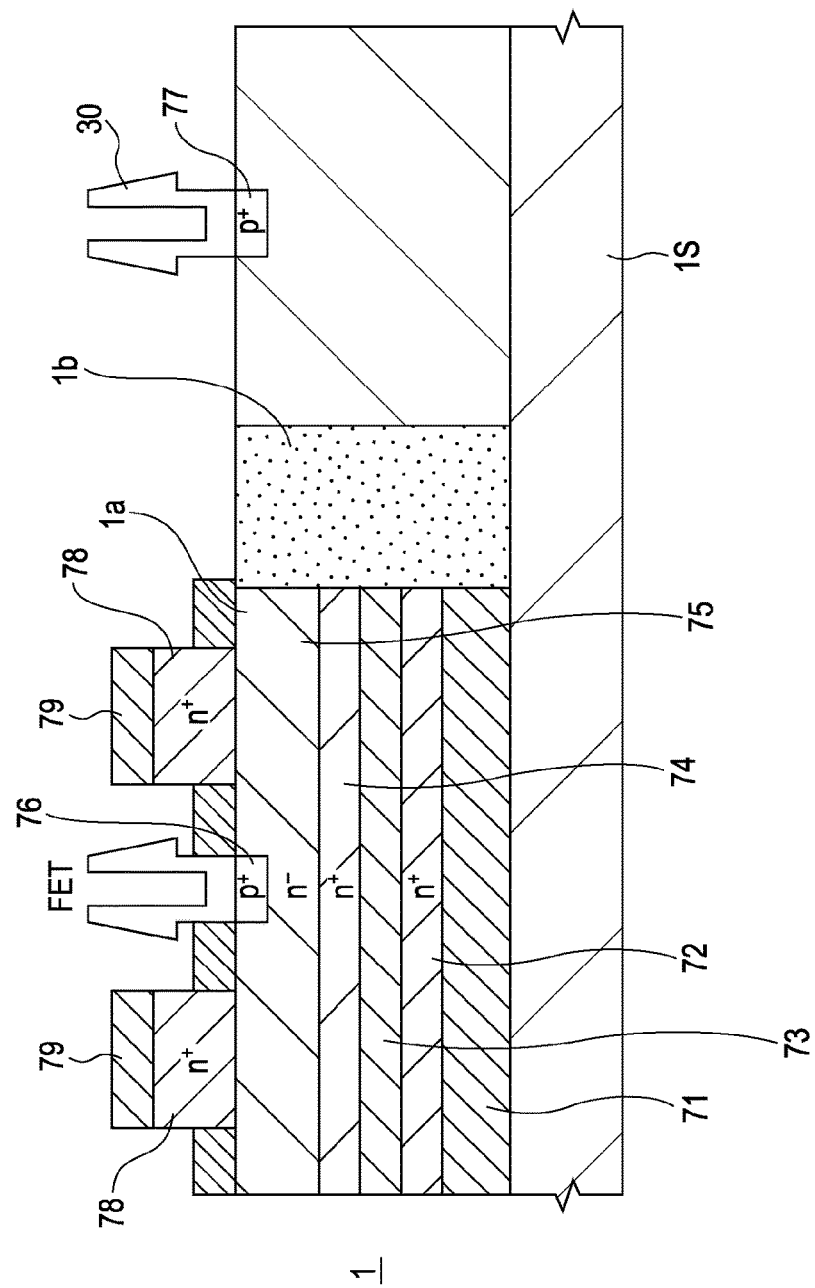
FIG. 6 is a schematic fragmentary cross-sectional view of a device according to another embodiment of the present invention.
Figure 7:
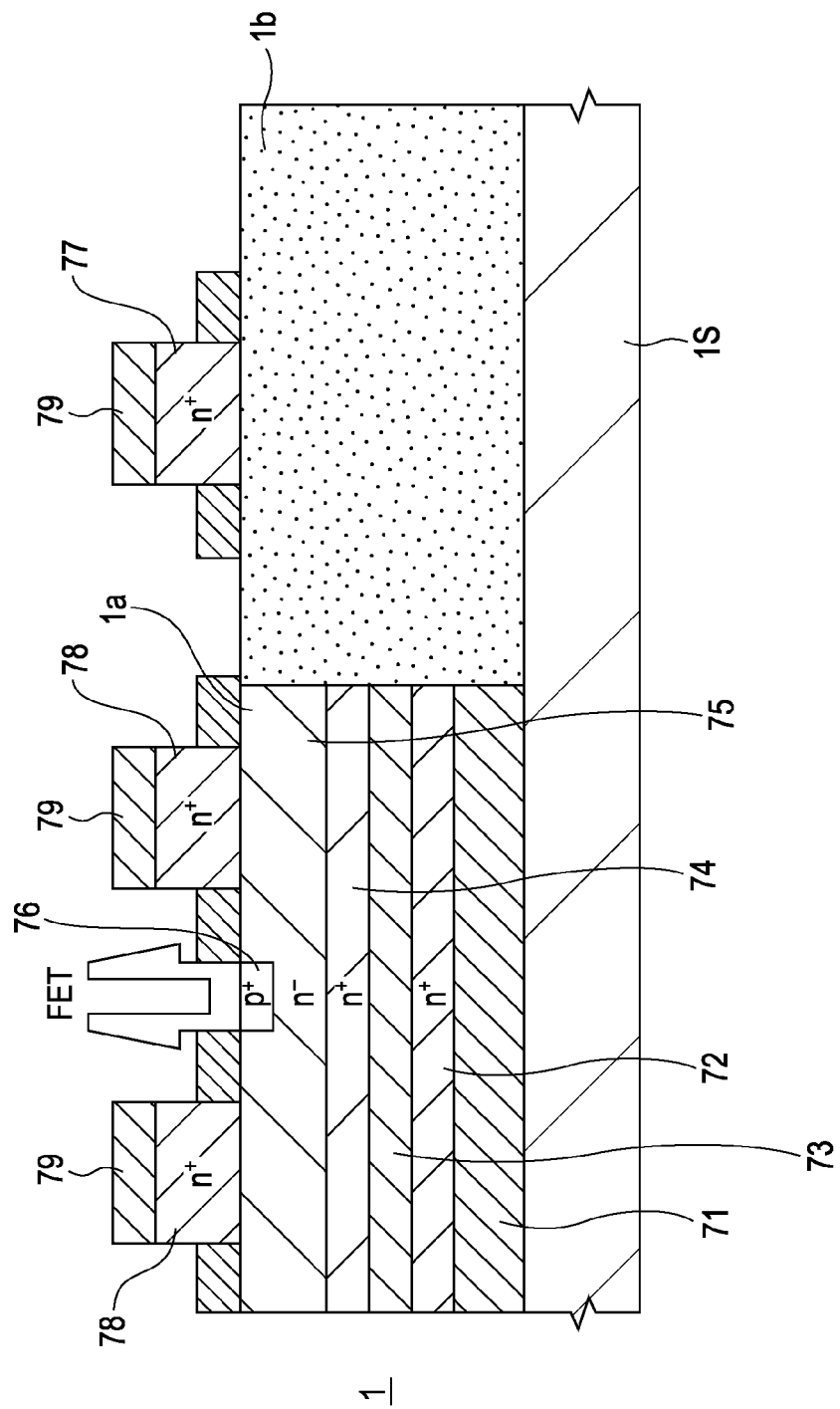
FIG. 7 is a schematic fragmentary cross-sectional view of a device according to another embodiment of the present invention.

FIGS. 5, 6, and 7 are each a schematic cross-sectional view showing an exemplary positional relationship between a field-effect transistor (FET) and the voltage-applying electrode 30. Each exemplified FET is a junction-gate pseudomorphic high-electron-mobility transistor (PHEMT). That is, the compound semiconductor substrate 1 provided with epitaxially grown semiconductor layers constituting the PHEMT is disposed on a semi-insulating (SI) GaAs substrate 1S or the like.

As shown in each of FIGS. 5, 6, and 7, for example, an undoped buffer layer 71 composed of AlGaAs, a first n-type-impurity-doped layer 72, a channel layer 73, a second n-type-impurity-doped layer 74, and a lightly doped layer 75 are formed in that order by epitaxial growth on the GaAs substrate 1S. A p-type gate region 76 is formed by ion implantation of Zn ions or the like.

Contact layers 78, which are each an n-type heavily doped source/drain composed of GaAs or the like, are disposed between the p-type gate region 76. Electrodes 79 are disposed on the respective contact layers 78. Thereby, the FET, which is HEMT, is formed.

In addition to the active region 1a including the circuit elements such as the FET, a high-resistivity nonactive region 1b formed by ion implantation of boron B is disposed so as to surround the active region 1a or to separate a plurality of active regions.

As shown in FIG. 5 or 7, the voltage-applying electrode 30 may be disposed on the nonactive region 1b. Alternatively, as shown in FIG. 6, which is a schematic cross-sectional view, the voltage-applying electrode 30 may be disposed on another active region 1a separated from the active region 1a including the FET by the nonactive region 1b.

The voltage-applying electrode 30 is in contact with an impurity-doped region 77 of the same conductivity type as that of the channel (channel-forming region) or the same conductivity type as that of the gate.

In this structure, it was confirmed that distortion characteristics and isolation were further stabilized and improved. This is believed to result from the successful application of a positive voltage to the back side of the FET.

The impurity-doped region 77 can be formed simultaneously with, for example, the formation of the p-type gate region 76 of the FET, such as the HEMT, or the contact layers 78, which are each a source/drain.

In the above-described embodiment, the nonactive region 1b is formed by ion implantation. Alternatively, the active region 1a may be formed in a high-resistivity semiconductor layer by ion implantation depending on the structure of the FET.

Figure 8:
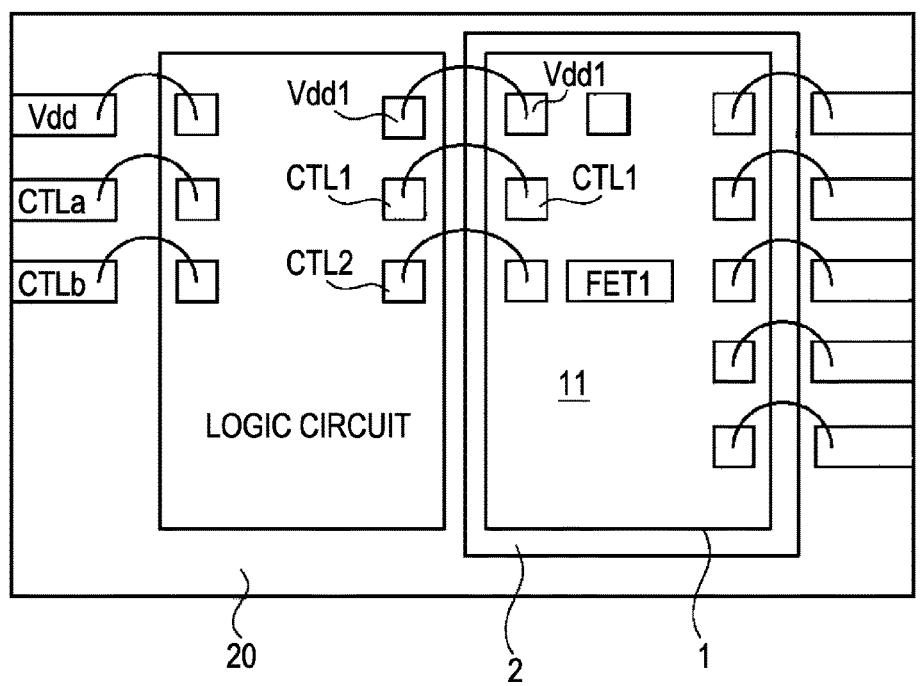
FIG. 8 is a schematic plan view of a device according to another embodiment of the present invention.

In each of the above-described embodiments, the switching circuit 11 and the logic circuit 12 are disposed on the common compound semiconductor substrate 1. Alternatively, as shown in FIG. 8, which is a schematic plan view, a high-frequency device having the following structure may be formed: for example, only the switching circuit 11 is disposed on the GaAs compound semiconductor substrate 1. A logic circuit is disposed on, for example, a Si substrate, which is a Group IV element semiconductor substrate, different from the compound semiconductor substrate 1. The switching circuit 11 is connected to the logic circuit with lead wires or the like. In FIG. 8, the same or equivalent elements are designated using the same reference numerals, and redundant description is not repeated.

Figure 9:
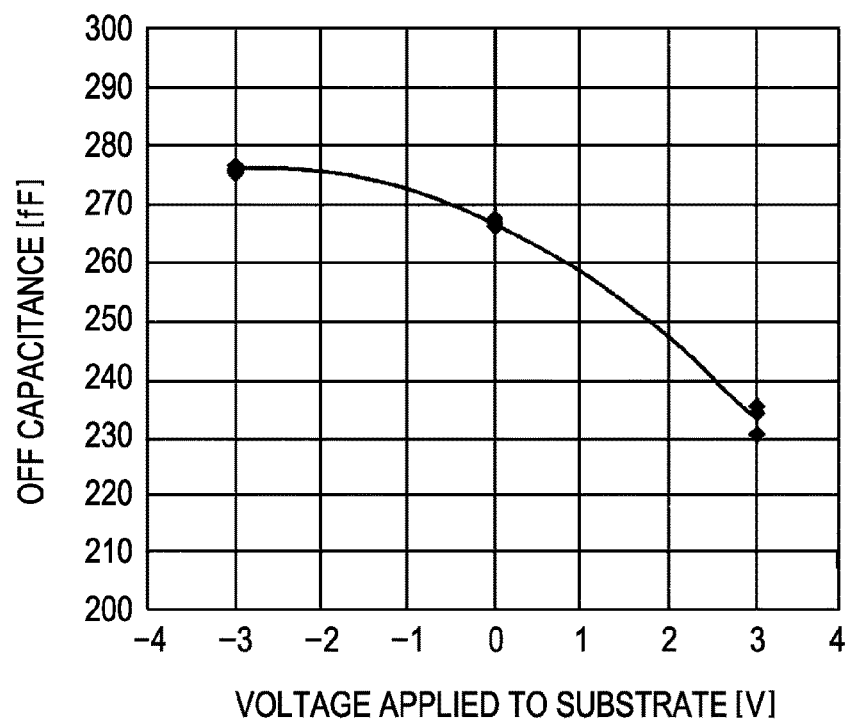
FIG. 9 is a graph showing the dependence of the OFF capacitance of a field-effect transistor on voltage applied to a substrate of a device according to an embodiment of the present invention.

FIG. 9 is a graph showing the dependence of the OFF capacitance of the field-effect transistor FET1 on bias voltage applied to the compound semiconductor substrate 1. In this case, it is found that the OFF capacitance is reduced by 10% when a voltage of 3 V is applied to the substrate.

That is, with respect to switching properties, isolation is improved.

The device shown in FIG. 3 is a high-frequency device having a dual pole dual throw (DPDT) switch. In this case, intermodulation distortions IMD2 and IMD3 are significantly improved.

Figure 10:
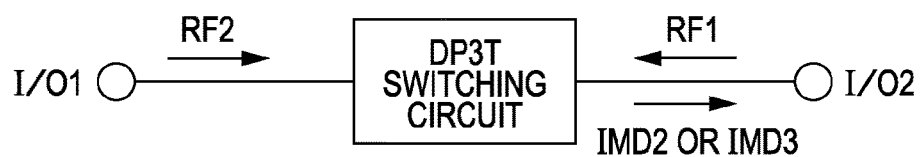
FIG. 10 is an illustration of a distortion measurement on a known device and a device according to an embodiment of the present invention.
Figure 13:
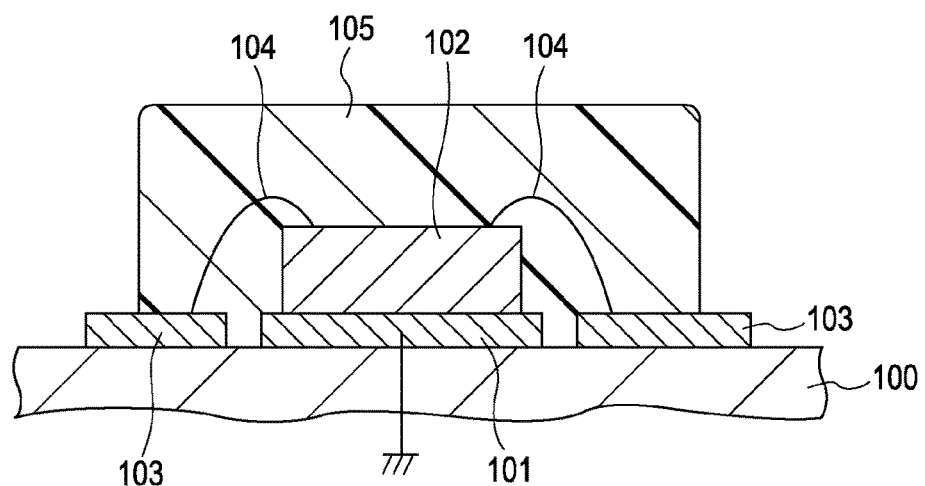
FIG. 13 is a schematic cross-sectional view of a known switch MMIC.
Figure 14:
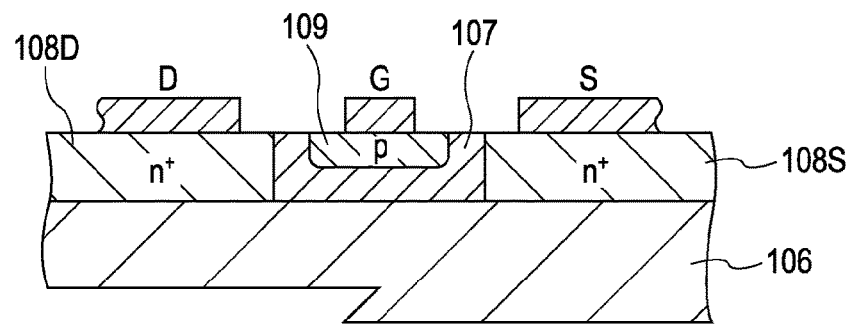
FIG. 14 is a schematic cross-sectional view of a field-effect transistor constituting a known switching circuit.

As shown in FIG. 10, high-frequency input signals RF2 and RF1 are fed to a dual pole 3 throw (DP3T) switching circuit between input/output terminals I/O1 and I/O2. FIG. 11 shows second- and third-order intermodulation distortions in an inventive example, in which a voltage is applied to a substrate, and a related example, in which a voltage is not applied to a substrate. As is clear from the results, in the inventive example, the intermodulation distortions are improved.

As described above, a high-frequency device, corresponding to 3G, according to the embodiment of the present invention meets the stringent requirements, i.e., has improved high-frequency characteristics, in particular, reduced distortion.

The present invention is not limited to the above-described embodiments.

It should be understood by those skilled in the art that various modifications, combinations, sub-combinations and alterations may occur depending on design requirements and other factors insofar as they are within the scope of the appended claims or the equivalents thereof.

What is claimed is:

1. A high-frequency device having a switching circuit, the high-frequency device comprising:
   a first substrate;
   a second substrate on the first substrate;
   an active region on a first surface of the second substrate, the first surface facing away from the first substrate;
   a switching circuit within the active region;
   an electrode directly on the second substrate, the electrode being isolated from the switching circuit at least on the first surface of the second substrate;
   a terminal on, but insulated from, the second substrate;
   a resistor in the second substrate and connected to the electrode and the terminal; and
   a voltage source,
   wherein,
      the electrode is not connect to a ground potential, and
      the electrode is in direct contact with the second substrate such that a positive voltage signal from the voltage source can be applied to the second substrate via the terminal, the resistor, and the electrode.

2. The device of claim 1, wherein the second substrate includes a non-active region formed by ion implantation.

3. The device of claim 1, wherein the second substrate includes a non-active region formed by etching.

4. The device of claim 1, wherein the second substrate includes a non-active region and the electrode is located within the non-active region.

5. The device of claim 1, wherein the second substrate includes:
   a non-active region; and
   a field effect transistor in the switching circuit;
   an impurity-doped region in the non-active region, the impurity-doped region having a conductivity type the same as that of a channel of the field effect transistor wherein,
   the electrode is in contact with the impurity-doped region.

6. The device of claim 1, further comprising a metal plate located between the second substrate and the first substrate, the metal plate being attached to the second substrate, and the metal plate being connected to the electrode.

7. The device of claim 1, wherein the second substrate is a GaAs substrate.

8. A device comprising:
   a first substrate;
   a second substrate on the first substrate, the second substrate having an active region;
   an electrode on the second substrate;
   a resistor in the second substrate and electrically coupled to the electrode;
   a terminal on, but insulated from, the second substrate;
   a switching circuit located on a first surface of the second substrate, the first surface facing away from the first substrate; and
   a voltage power source,
   wherein,
      the electrode is isolated from the switching circuit at least on the first surface of the second substrate,
      the electrode is not connected to ground, and
      the electrode is in direct contact with the second substrate such that a positive voltage signal from the voltage power source can be applied to the second substrate via the terminal, resistor, and electrode.

* * * * *